(12) United States Patent
Su

(10) Patent No.: US 8,642,368 B2
(45) Date of Patent: Feb. 4, 2014

(54) ENHANCEMENT OF LED LIGHT EXTRACTION WITH IN-SITU SURFACE ROUGHENING

(75) Inventor: Jie Su, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 301 days.

(21) Appl. No.: 13/045,387

(22) Filed: Mar. 10, 2011

(65) Prior Publication Data

US 2011/0227037 A1    Sep. 22, 2011

Related U.S. Application Data

(60) Provisional application No. 61/313,538, filed on Mar. 12, 2010.

(51) Int. Cl.
*H01L 21/00* (2006.01)

(52) U.S. Cl.
USPC .......... 438/42; 438/46; 257/E21.398

(58) Field of Classification Search
USPC ............... 438/42, 46; 257/E21.398
See application file for complete search history.

(56) References Cited

U.S. PATENT DOCUMENTS

| | | | |
|---|---|---|---|
| 6,821,804 B2 | 11/2004 | Thibeault et al. | |
| 7,037,738 B2 | 5/2006 | Sugiyama et al. | |
| 7,560,364 B2 | 7/2009 | Bour et al. | |
| 2002/0175341 A1* | 11/2002 | Biwa et al. | 257/103 |
| 2003/0119218 A1* | 6/2003 | Jang | 438/46 |
| 2007/0259464 A1 | 11/2007 | Bour et al. | |
| 2008/0251803 A1* | 10/2008 | Cho et al. | 257/94 |
| 2010/0012969 A1* | 1/2010 | Yoon et al. | 257/99 |
| 2010/0025717 A1 | 2/2010 | Fujii et al. | |
| 2010/0051980 A1* | 3/2010 | Miki et al. | 257/94 |

OTHER PUBLICATIONS

Chia-Feng Lin et al., "Blue Light-Emitting Diodes with a Roughned Backside Fabricated by Wet Etching." Appl. Phys. Letters 95, pp. 201102-1 thru 201102-3 (2009).
Hung-Wen Huang, et al., "Investigation of InGaN/GaN Light Emitting Diodes with Nano-Roughened Surface by Excimer Laser Etching Method." Materials Science and Engineering B 136 (2007), pp. 182-186.

* cited by examiner

*Primary Examiner* — Phat X Cao
(74) *Attorney, Agent, or Firm* — Patterson & Sheridan, LLP

(57) ABSTRACT

The embodiments of the present invention generally relates to methods for enhancing the light extraction by surface roughening of the bottom n-GaN layer and/or top p-GaN layer so that the internal light from the active region is scattered outwardly to result in a higher external quantum efficiency. In one embodiment, a surface roughening process is performed on the n-GaN layer to form etching pits in a top surface of the n-GaN layer. Once the etching pits are formed, growth of the n-GaN material may be resumed on the roughened n-GaN layer to partially fill the etching pits, thereby forming air voids at the interface of the n-GaN layer and the subsequent, regrowth n-GaN layer. These air voids provide one or more localized regions with indices of reflection different from that of the n-GaN layer, such that the internal light generated by the active layers (e.g., the InGaN MQW layer), when passing through the n-GaN layer, is scattered by voids or bubbles. The surface roughening process may be further performed on a top surface of a p-GaN layer to scatter the light emitted from the active layers outwardly rather than being reflected back to the active layers.

19 Claims, 10 Drawing Sheets

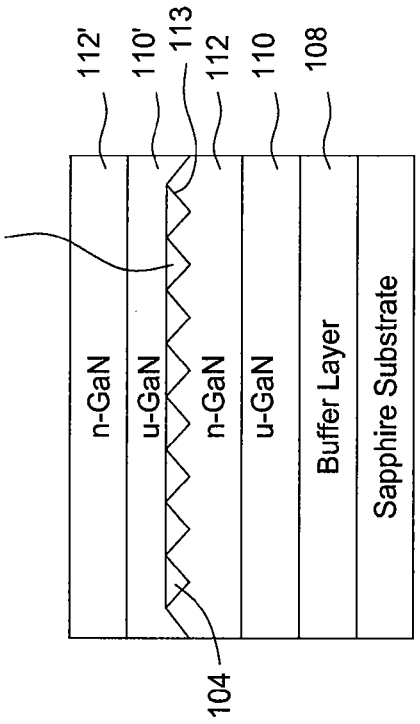
FIG. 6D
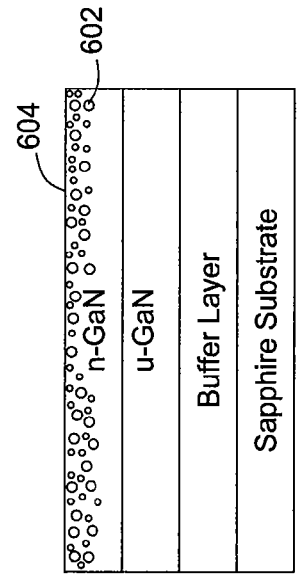
FIG. 6C' (ALTERNATIVE EMBODIMENT)
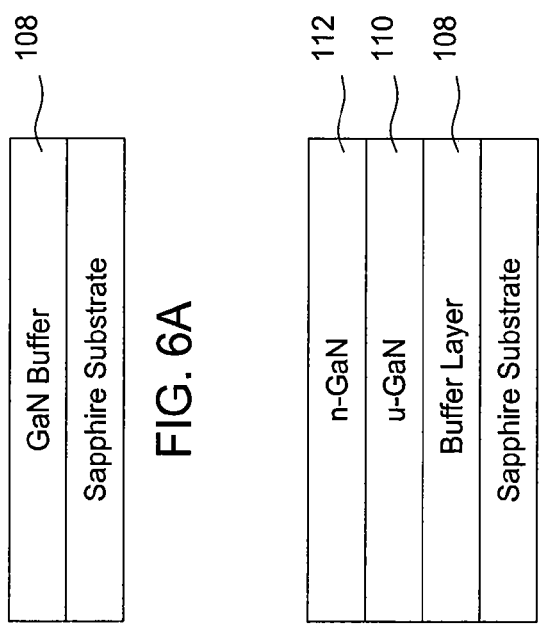
FIG. 6A
FIG. 6B
FIG. 6C

ENHANCEMENT OF LED LIGHT EXTRACTION WITH IN-SITU SURFACE ROUGHENING

CROSS-REFERENCE TO RELATED APPLICATIONS

This application claims benefit of U.S. provisional patent application Ser. No. 61/313,538, filed Mar. 12, 2010, which is herein incorporated by reference.

BACKGROUND OF THE INVENTION

1. Field of the Invention

Embodiments of the present invention generally relate to the manufacturing of optoelectronic devices, such as light emitting diodes (LEDs), laser diodes (LDs) and, more particularly, to processes for enhancing the light extraction by surface roughening of Group III-V materials used in optoelectronic devices.

2. Description of the Related Art

Group III-V materials are finding greater importance in the development and fabrication of a variety of semiconductor devices, such as short wavelength LEDs, LDs, and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, comprising Group II-VI elements.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the layer depends in part upon deposition uniformity which, in turn, depends upon uniform flow and mixing of the precursors across the substrate.

While the feasibility of using GaN to create photoluminescence in the blue region of the spectrum has been known for decades, there were numerous barriers that impeded their practical fabrication. For example, the external quantum efficiency for GaN based LEDs is limited by their inability to emit all of the light that is generated by the active layers. When an LED is energized, light emitting in all directions from its active layer (e.g., InGaN multi-quantum-well (MQW) layer) reaches the emitting surfaces at many different angles. However, according to Snell's law (also known as the law of refraction), light traveling from a region having a higher index of refraction to a region with a low index of refraction that is within a certain critical angle (relative to the surface normal direction) will cross to the lower index region. Considering the refractive indexes of GaN (n>2.4) and air (n=1), the critical angle for the light to escape is about 23°. Light that reaches the surface beyond the critical angle will not cross but will be repeatedly reflected into the substrate and trapped inside the active layers, unless it escapes through the sidewalls. Assuming the light emitted from sidewalls and the backside is neglected, it is expected that approximately only 4% of the internal light can be extracted. Due to this phenomenon, the light extraction efficiency has not been satisfactory since the majority of lights generated by conventional LEDs do not emit as expected.

As the demand for LEDs, LDs, transistors, and integrated circuits increases, the efficiency of depositing high quality Group-III nitride layers takes on greater importance. Therefore, there is a need for an improved process and apparatus that can increase the light extraction efficiency while maintaining the consistent layer quality over larger substrates.

SUMMARY OF THE INVENTION

Embodiments described herein generally relate to methods for forming Group III-V materials used in optoelectronic devices, such as light emitting diodes (LEDs) and laser diodes (LDs). Particularly, embodiments of the present invention provide methods for enhancing the light extraction by surface roughening of the bottom n-GaN layer and/or top p-GaN so that the internal light from the active region is scattered outwardly to result in higher external quantum efficiency. In one embodiment, a method for fabricating a compound nitride-based semiconductor structure is provided. The method includes forming a first group III nitride layer over a substrate, subjecting the first group III nitride layer to a surface roughening process to form etching pits in a top surface of the first group III nitride layer, partially filling the etching pits with a second group III nitride layer to form voids between the second group III nitride layer and the top surface of the first group III nitride layer, forming a multi-quantum-well (MQW) active layer over the second group III nitride layer, and forming a third group III nitride layer over the multi-quantum-well active layer, wherein the second group III nitride layer has opposite conductivity type from the first group III nitride layer. The first and second group III nitride layers may include n-doped GaN or undoped GaN material, respectively.

In another embodiment, a compound nitride-based semiconductor structure is provided. The structure includes an n-doped GaN layer formed on a substrate, an InGaN multi-quantum-well (MQW) active layer formed over the n-doped GaN layer on the substrate, a p-doped AlGaN layer formed over the InGaN MQW active layer, and a p-doped GaN layer formed over the p-doped AlGaN layer, wherein the p-doped GaN layer has a roughened top surface having an average surface roughness (Ra) ranging from about 10 nm to about 5000 nm. In one example, at least a surface region of the n-doped GaN layer has a refractive index different from a refractive index of the n-doped GaN layer.

In yet another embodiment, a compound nitride-based semiconductor structure formed on a substrate is provided. The structure includes a Group III-V epitaxy layer disposed over the substrate, comprising a first undoped GaN layer, a first n-doped GaN layer formed on the first undoped GaN layer, wherein a top surface of the first n-doped GaN layer has a light reflection layer formed thereon, a second undoped GaN layer formed on the light reflection layer, and a second n-doped GaN layer formed on the second undoped GaN layer, an InGaN multi-quantum-well (MQW) active layer formed over the Group III-V epitaxy layer, a p-doped AlGaN layer formed over the InGaN MQW active layer, and a p-doped GaN layer formed over the p-doped AlGaN layer. In one example, the light reflection layer may include a n-doped GaN or undoped GaN material having air voids embedded therein.

In one another embodiment, a processing system for processing a compound nitride-based semiconductor structure is provided. The system includes a first substrate handling system configured to transfer one or more substrates from an input region to a first processing chamber configured to deposit one or more Group III-V layers over the one or more substrates, wherein the first processing chamber comprises a metal organic chemical vapor deposition (MOCVD) chamber, a hydride vapor phase epitaxial (HVPE) chamber, a physical vapor deposition (PVD) chamber, a chemical vapor deposition (CVD) chamber, an atomic layer deposition (ALD) chamber, or a sputtering chamber, a second processing chamber configured to deposit a p-doped GaN layer over the one or more Group III-V layers formed on the one or more substrates wherein the second processing chamber comprises a MOCVD chamber or a hydride vapor phase epitaxial (HVPE) chamber, a halogen containing gas source coupled to the first processing chamber and configured to flow a halogen containing gas into the first processing chamber to roughen at least a portion of a top surface of the n-doped GaN layer, and an automatic transferring system configured to transfer the one or more substrates between the first processing chamber and the second processing chamber without exposing the one or more substrates to an environment atmospheric environment. In one example, the halogen containing gas source is coupled with the second processing chamber configured to flow a halogen containing gas into the second processing chamber to roughen at least a portion of a top surface of a p-doped GaN layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A to 6H are schematic cross-sectional views of a LED structure formed using the processing sequence of FIG. 5.

DETAILED DESCRIPTION

Embodiments described herein generally relate to methods for forming Group III-V materials used in optoelectronic devices, such as light emitting diodes (LEDs) and laser diodes (LDs). Particularly, embodiments of the present invention provide methods for enhancing the light extraction by surface roughening of the bottom n-GaN layer and/or top p-GaN so that the internal light from the active region is scattered outwardly to result in higher external quantum efficiency. In one embodiment, a surface roughening process is performed on an n-doped GaN (n-GaN) layer to form etching pits in a top surface of the n-GaN layer. Once the etching pits are formed, growth of the n-GaN material may be resumed on the roughened n-GaN layer to partially fill the underlying etching pits, thereby forming air voids or bubbles at the interface of the n-GaN layer and the subsequent, re-growth n-GaN layer. These voids or bubbles are believed to provide one or more localized regions with indices of reflection different from that of the n-GaN layer, such that the internal light generated by the active layers (e.g., the InGaN MQW layer), when passing through the n-GaN layer, is scattered by air voids or bubbles and thus improving light extraction efficiency. To enhance the overall light extraction, the surface roughening process may be further performed on a top surface of a p-GaN layer so that the light emitted from the active layers is scattered by the roughened p-GaN layer surface rather than being reflected back to the active layers.

Figure 1:
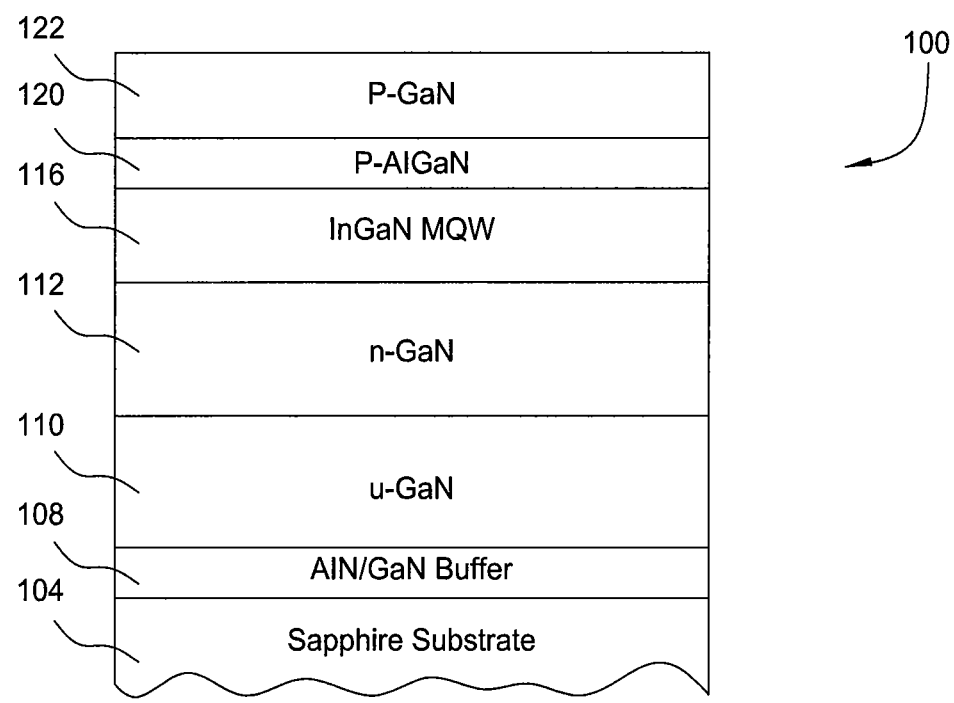
FIG. 1 is a schematic illustration of a structure of an exemplary GaN-based LED.

Currently, metal organic chemical vapor deposition (MOCVD) and hydride vapor phase epitaxial (HVPE) processes are the most widely used techniques for the growth of Group III-V devices that act as light emitting diodes and/or laser diodes, among other devices. FIG. 1 shows an exemplary Group III-V device that may be made using the present systems and methods. A nitride-based LED structure 100 is illustrated formed over a substrate 104, for example a (0001) sapphire substrate. An undoped GaN (u-GaN) layer 110 followed by an n-type GaN (n-GaN) layer 112 is deposited over a GaN or AlN buffer layer 108 formed over the substrate 104. Substrate size may range from 50 mm-100 mm in diameter or larger. The exemplary substrates may include, but are not limited to sapphire, SiC, GaN, silicon, quartz, GaAs, AlN or glass. An active region of the device is embodied in a multi-quantum-well (MQW) layer 116, shown in the drawing to comprise an InGaN layer. A p-n junction is formed with an overlying p-type AlGaN layer 120 acting as the electron blocking layer (EBL), with a p-type GaN contact layer 122 acting as a contact layer.

A typical fabrication process for such an LED may use a MOCVD or HVPE process that follows cleaning of the substrate 104 in a processing chamber. Alternatively, the substrate 104 may be an epi-ready Sapphire or Si wafer that is directly transferred into the processing chamber without any acid etching or cleaning. In case where the MOCVD process is adapted, the MOCVD deposition is accomplished by providing flows of suitable precursors to the processing chamber and using thermal processes to achieve deposition. For example, a GaN layer may be deposited using gallium and nitrogen containing precursors, perhaps with a flow of a fluent gas like $N_2$, $H_2$, and $NH_3$. An InGaN layer may be deposited using Ga, N, and In precursors, perhaps with a flow of a fluent gas. An AlGaN layer may be deposited using Ga, N, and Al precursors, also perhaps with a flow of a fluent gas.

In the illustrated structure 100 shown in FIG. 1, a GaN/AlN buffer layer 108 is deposited over the cleaned substrate 104. The buffer layer may be doped or undoped. As the sapphire substrate has been reported not completely satisfactory because it provides approximately a 15% lattice mismatch with the GaN, the use of a buffer layer 108 of GaN or AlN has been found effective in accommodating the lattice mismatch. The GaN/AlN buffer layer 108 may be formed by a MOCVD process or a HVPE process. The typical GaN layer 108 has a thickness ranging from about 100 Å to about 500 Å, and may be deposited at a temperature of about 550° C. for above 5 minutes.

Subsequent depositions of the u-GaN layer 110 and n-GaN layer 112 may be formed by a MOCVD process or a HVPE process. The u-GaN layer 110 and n-GaN layer 112 may be deposited at a higher temperature, such as around 1050° C. The u-GaN layer 110 and n-GaN layer 112 are relatively thick. In one embodiment, the u-GaN layer 110 may have a thickness of about 1-2 μm and the n-GaN layer 112 may have a thickness on the order of 2-4 μm, which may require about 140 minutes for deposition. While u-GaN layer 110 is shown here, it is contemplated that the u-GaN layer may be omitted depending upon the application.

The InGaN multi-quantum-well (MQW) layer 116 is subsequently deposited over the n-GaN layer 112. The InGaN MQW layer 116 may have a thickness of about 750 Å, which may be deposited over a period of about 40 minutes to several hours at a temperature of about 750° C. Thereafter, the p-AlGaN layer 120 is deposited over the InGaN MQW layer 116. The p-AlGaN layer 120 serves as an electron blocking layer (EBL) to confine electrons in the active region and prevent electron overflow to the p-GaN contact layer 122. In one embodiment, the p-AlGaN layer 120 may have a thickness of about 200-500 Å, which may be deposited in about 5 minutes at a temperature ranging from about 950° C. to about 1020° C.

The p-GaN contact layer 122 is then deposited over the p-AlGaN layer 120. The thickness of the p-GaN contact layer 122 that completes the structure may be about 0.1-0.5 μm or thicker, which may be deposited at a temperature of about 1050° C. for around 25 minutes. Additionally, dopants, such as silicon (Si) or magnesium (Mg), may be added to the layers. The layers may be doped by adding small amounts of dopant gases during the deposition process. For silicon doping, silane ($SiH_4$) or disilane ($Si_2H_6$) gases may be used, for example, and a dopant gas may include Bis(cyclopentadienyl) magnesium ($Cp_2Mg$ or $(C_5H_5)_2Mg$) for magnesium doping.

In one embodiment, the aforementioned steps are performed in a single MOCVD chamber without any growth interruption. However, the growth of GaN at high temperatures results in severe parasitic deposition of Ga metal and GaN within the MOCVD chamber, especially on chamber components including the showerhead or gas distribution assembly. Gallium rich depositions cause problems due to the nature of gallium itself which acts as a trap, reacting with the gas phase precursors used for deposition of subsequent single layers of LED, such as, for example, tri-methyl indium (TMI), tri-methyl aluminum (TMA), n-type dopants such as silane ($SiH_4$) and disilane ($Si_2H_6$), and p-type dopants such as $Cp_2Mg$. InGaN multi-quantum wells (MQW) are the most affected due to Ga—In eutectic formation at favorable conditions within the MOCVD chamber, leading to PL wavelength drift, PL intensity reduction, and device degradation in general. In addition, multiple deposition steps being performed in a single reactor in a single session results in a long processing time, usually on the order of 4-10 hours. This long processing time results in low reactor throughput. Therefore, in addition to the in-situ surface roughening process, embodiments of the present invention may adapt "two-split process" using multiple processing chambers to minimize or even eliminate cross contamination between different layers, as will be discussed in details below.

Exemplary Hardware

Figure 2:
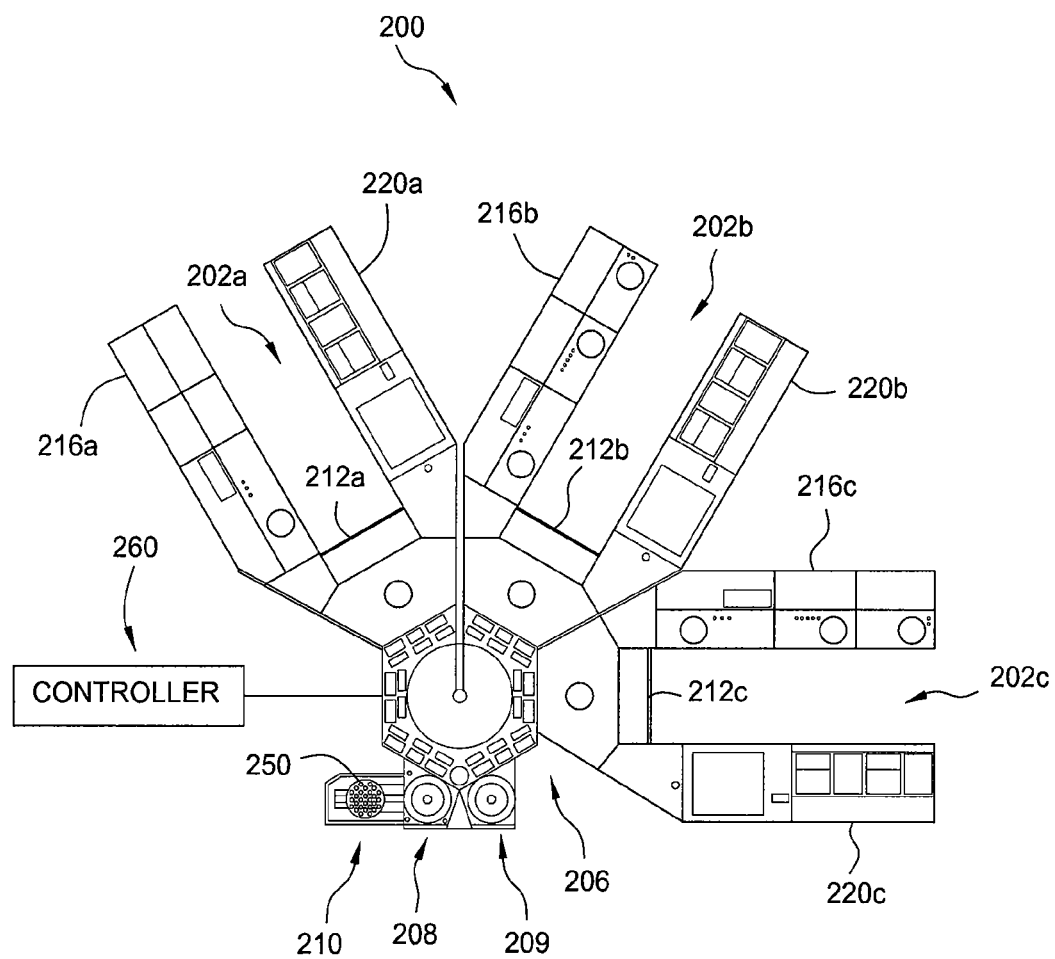
FIG. 2 is a schematic top view illustrating one embodiment of a processing system for fabricating compound nitride semiconductor devices according to embodiments described herein.

FIG. 2 is a schematic top view of an exemplary processing system 200 that may be used for fabricating compound nitride semiconductor devices according to at least one embodiment of the invention. It is contemplated that the processes described below in conjunction with FIG. 5 may be also preformed in other suitable processing chambers.

The processing system 200 comprises a transfer chamber 206 housing a substrate handler (not shown), a first MOCVD chamber 202a, a second MOCVD chamber 202b, and a third MOCVD chamber 202c coupled with the transfer chamber 206, a load lock chamber 208 coupled with the transfer chamber 206, a batch load lock chamber 209, for storing substrates, coupled with the transfer chamber 206, and a load station 210, for loading substrates, coupled with the load lock chamber 208. The transfer chamber 206 comprises a robot assembly (not shown) operable to pick up and transfer substrates between the load lock chamber 208, the batch load lock chamber 209, and the MOCVD chambers 202a-c. Although three MOCVD chambers 202a, 202b, 202c are shown, it should be understood that any number of MOCVD chambers may be coupled with the transfer chamber 206. Additionally, chambers 202a, 202b, 202c may be combinations of one or more MOCVD chambers (such as the MOCVD chamber 300 shown in FIG. 3) with one or more Hydride Vapor Phase Epitaxial (HVPE) chambers (such as the HVPE chamber 400, 401 shown in FIGS. 4A and 4B) coupled with the transfer chamber 206. Alternatively, the processing system 200 may be an in-line system without a transfer chamber. In various embodiments, a PVD, CVD, ALD, or Sputtering chamber may be additionally included or replaced with one of the MOCVD or HVPE chambers coupled to the transfer chamber 206 upon application.

Each MOCVD chamber 202a, 202b, 202c generally includes a chamber body 212a, 212b, 212c forming a processing region where a substrate is placed to undergo processing, a chemical delivery module 216a, 216b, 216c from which gas precursors are delivered to the chamber body 212a, 212b, 212c, and an electrical module 220a, 220b, 220c for each MOCVD chamber 202a, 202b, 202c that includes the electrical system for each MOCVD chamber of the processing system 200. Each MOCVD chamber 202a, 202b, 202c is adapted to perform CVD processes in which metalorganic elements react with metal hydride elements to form thin layers of compound nitride semiconductor materials.

The transfer chamber 206 may remain under vacuum or at a pressure below atmospheric pressure during processing. The vacuum level of the transfer chamber 206 may be adjusted to match the vacuum level of the MOCVD chamber 202a. For example, when transferring a substrate from the transfer chamber 206 into the MOCVD chamber 202a (or vice versa), the transfer chamber 206 and the MOCVD chamber 202a may be maintained at the same vacuum level. Then, when transferring a substrate from the transfer chamber 206 to the load lock chamber 208 or batch load lock chamber 209 (or vice versa), the transfer chamber vacuum level may match the vacuum level of the load lock chamber 208 or batch load lock chamber 209 even through the vacuum level of the load lock chamber 208 or batch load lock chamber 209 and the MOCVD chamber 202a may be different. In certain applications it may be desirable to backfill the transfer chamber 206 with an inert gas such as nitrogen. For example, the substrate may be transferred in an environment having greater than 90% $N_2$ or $NH_3$. Alternatively, the substrate may be transferred in a high purity $H_2$ environment, such as in an environment having greater than 90% $H_2$.

In the processing system 200, the robot assembly transfers a carrier plate 250 loaded with substrates into the first MOCVD chamber 202a to undergo a first deposition process. The carrier plate may range from 200 mm-750 mm. The substrate carrier may be formed from a variety of materials, including SiC or SiC-coated graphite. In one embodiment, the carrier plate 250 comprises a silicon carbide material and has a surface area of about 1,000 $cm^2$ or more, preferably 2,000 $cm^2$ or more, and more preferably 4,000 $cm^2$ or more. Exemplary embodiments of the carrier plate are further described in U.S. Provisional Patent Application Ser. No. 61/237,948, filed Aug. 28, 2009, entitled "WAFER CARRIER DESIGN FOR IMPROVED PHOTOLUMINESCENCE UNIFORMITY". The robot assembly transfers the carrier plate 250 into the second MOCVD chamber 202b to undergo a second deposition process. The robot assembly transfers the carrier plate 250 into either the first MOCVD chamber 202a or the third MOCVD chamber 202c to undergo a third deposition process. After all or some of the deposition steps have been completed, the carrier plate 250 is transferred from the MOCVD chamber 202a-202c back to the load lock chamber 208. The carrier plate 250 is then transferred to the load station 210. Alternatively, the carrier plate 250 may be stored in either the load lock chamber 208 or the batch load lock chamber 209 prior to further processing in the MOCVD chamber 202a-202c. One exemplary system is described in U.S. patent application Ser. No. 12/023,572, filed Jan. 31, 2008, entitled "PROCESSING SYSTEM FOR FABRICATING COMPOUND NITRIDE SEMICONDUCTOR DEVICES".

A system controller 260 controls activities and operating parameters of the processing system 200. The system controller 260 includes a computer processor, support circuits and a computer-readable memory coupled to the processor. The processor executes system control software, such as a computer program stored in memory. Further discussion regarding aspects of the processing system and methods of use can be found in U.S. patent application Ser. No. 11/404,516, filed Apr. 14, 2006, now published as US 2007/024516, entitled "EPITAXIAL GROWTH OF COMPOUND NITRIDE STRUCTURES".

Exemplary MOCVD Chamber

Figure 3:
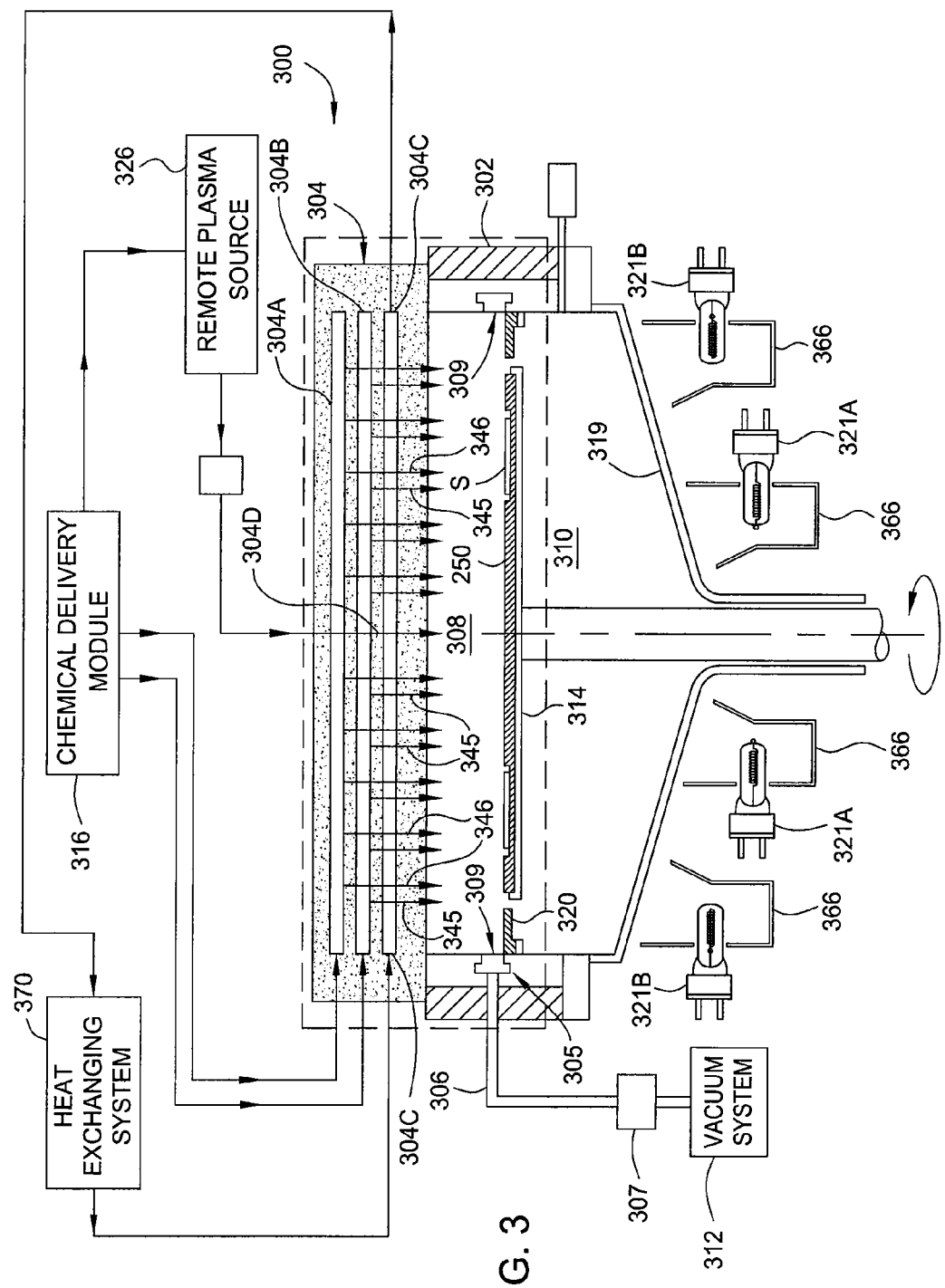
FIG. 3 is a schematic cross-sectional view of a metal-organic chemical vapor deposition (MOCVD) chamber for fabricating compound nitride semiconductor devices according to embodiments described herein.

FIG. 3 is a schematic cross-sectional view of an MOCVD chamber 300 that may be used for fabricating compound nitride semiconductor devices according to at least one embodiment of the invention. The MOCVD chamber 300 may be one or more of the chambers 202a, 202b or 202c, as described above with reference to system 200. The MOCVD chamber 300 generally includes a chamber body 302, a chemical delivery module 316 for delivering precursor gases, carrier gases, cleaning gases, and/or purge gases, a remote plasma system 326 with a plasma source, a susceptor or substrate support 314, and a vacuum system 312. The chamber body 302 of the MOCVD chamber 300 encloses a processing region 308. A showerhead assembly 304 is disposed at one end of the processing region 308, and a carrier plate 250 is disposed at the other end of the processing region 308. The carrier plate 250 may be disposed on the substrate support 314.

In one embodiment, the showerhead assembly 304 may be a dual-zone assembly having a first processing gas channel 304A coupled with the chemical delivery module 316 for delivering a first precursor or first process gas mixture to the processing region 308, a second processing gas channel 304B coupled with the chemical delivery module 316 for delivering a second precursor or second process gas mixture to the processing region 308 and a temperature control channel 304C coupled with a heat exchanging system 370 for flowing a heat exchanging fluid to the showerhead assembly 304 to help regulate the temperature of the showerhead assembly 304. Suitable heat exchanging fluids may include water, water-based ethylene glycol mixtures, a perfluoropolyether (e.g. Galden® fluid), oil-based thermal transfer fluids, or similar fluids.

During processing the first precursor or first process gas mixture may be delivered to the processing region 308 via gas conduits 346 coupled with the first processing gas channel 304A in the showerhead assembly 304 and the second precursor or second process gas mixture may be delivered to the processing region 308 via gas conduits 345 coupled with the second processing gas channel 304B in the showerhead assembly 304. The process gas mixtures or precursors may include one or more precursor gases or process gases as well as carrier gases or dopant gases which may be mixed with precursor gases. Exemplary showerheads that may be adapted to practice embodiments described herein are described in U.S. patent application Ser. No. 11/873,132, filed Oct. 16, 2007, entitled "MULTI-GAS STRAIGHT CHANNEL SHOWERHEAD," U.S. patent application Ser. No. 11/873,141, filed Oct. 16, 2007, now published as US 2009-0095222, entitled "MULTI-GAS SPIRAL CHANNEL SHOWERHEAD," and U.S. patent application Ser. No. 11/873,170, filed Oct. 16, 2007, now published as US 2009-0095221, entitled "MULTI-GAS CONCENTRIC INJECTION SHOWERHEAD."

A lower dome 319 is disposed at one end of a lower volume 310, and the carrier plate 250 is disposed at the other end of the lower volume 310. The carrier plate 250 is shown in a process position, but may be moved to a lower position where, for example, the substrates S may be loaded or unloaded. An exhaust ring 320 may be disposed around the periphery of the carrier plate 250 to help prevent deposition from occurring in the lower volume 310 and also help direct exhaust gases from the MOCVD chamber 300 to exhaust ports 309. The lower dome 319 may be made of transparent material, such as high-purity quartz, to allow light to pass through for radiant heating of the substrates S. The radiant heating may be provided by a plurality of inner lamps 321A and outer lamps 321B disposed below the lower dome 319 and reflectors 366 may be used to help control the MOCVD chamber 300 exposure to the radiant energy provided by inner and outer lamps 321A and 321B. Additional rings of lamps may also be used for finer temperature control of the substrates S.

A purge gas (e.g., a nitrogen containing gas) may be delivered into the MOCVD chamber 300 from the showerhead assembly 304 and/or from inlet ports or tubes (not shown) disposed below the carrier plate 250 and near the bottom of the chamber body. The purge gas enters the lower volume 310 of the MOCVD chamber 300 and flows upwards past the carrier plate 250 and exhaust ring 320 and into multiple exhaust ports 309 which are disposed around an annular exhaust channel 305. An exhaust conduit 306 connects the annular exhaust channel 305 to a vacuum system 312 which includes a vacuum pump 307. The MOCVD chamber 300 pressure may be controlled using a valve system which controls the rate at which the exhaust gases are drawn from the annular exhaust channel. Other aspects of the MOCVD chamber are described in U.S. patent application Ser. No. 12/023,520, filed Jan. 31, 2008, entitled "CVD APPARATUS".

If desired, a cleaning gas (e.g., a halogen containing gas, such as chlorine gas) may be delivered into the MOCVD chamber 300 from the showerhead assembly 304 and/or from inlet ports or tubes (not shown) disposed near the processing region 308. The cleaning gas enters the processing region 308 of the MOCVD chamber 300 to remove deposits from chamber components such as the substrate support 314 and the showerhead assembly 304 and exits the MOCVD chamber 300 via multiple exhaust ports 309 which are disposed around the annular exhaust channel 305.

The chemical delivery module 316 supplies precursor and/or chemicals to the MOCVD chamber 300. Reactive gases, carrier gases, purge gases, and cleaning gases are supplied from the chemical delivery system through supply lines and into the chamber 300. The gases may be supplied through supply lines and into a gas mixing box where they are mixed together and delivered to showerhead assembly 304. Depending upon the process scheme, some of the precursor and/or chemicals delivered to the MOCVD chamber 300 may be liquid rather than gas. When liquid chemicals are used, the chemical delivery module includes a liquid injection system or other appropriate mechanism (e.g. a bubbler or vaporizer) to vaporize the liquid. Vapor from the liquids may be mixed with a carrier gas.

Remote plasma system 326 can produce a plasma for selected applications, such as chamber cleaning or etching residue or defective layers from a process substrate. Plasma species produced in the remote plasma system 326 from precursors supplied via an input line are sent via a conduit 304D for dispersion through the showerhead assembly 304 to the processing region 308 in the MOCVD chamber 300. Precursor gases for a cleaning application may include chlorine containing gases, fluorine containing gases, iodine containing gases, bromine containing gases, nitrogen containing gases, and/or other suitable reactive elements. Remote plasma system 326 may also be adapted to deposit CVD layers by flowing appropriate deposition precursor gases into remote plasma system 326 during a layer deposition process. In one example, the remote plasma system 326 is used to deliver active nitrogen species to the processing region 308.

The temperature of the walls of the MOCVD chamber 300 and surrounding structures, such as the exhaust passageway, may be further controlled by circulating a heat-exchange liquid through channels (not shown) in the walls of the chamber to form a heat exchanger. The showerhead assembly 304 may also have heat exchanging passages (not shown) to form an additional heat exchanger. Typical heat-exchange fluids include water-based ethylene glycol mixtures, oil-based thermal transfer fluids, or similar fluids. The heating of the showerhead assembly 304 may be performed using additional heat exchanger(s) to reduce or eliminate condensation of undesirable reactant products and improve the elimination of volatile products of the process gases and other contaminants that might contaminate the process if they were to condense on the walls of the exhaust conduit 306 and migrate back into the processing chamber during periods of no gas flow.

Exemplary HVPE Chamber

Figure 4A:
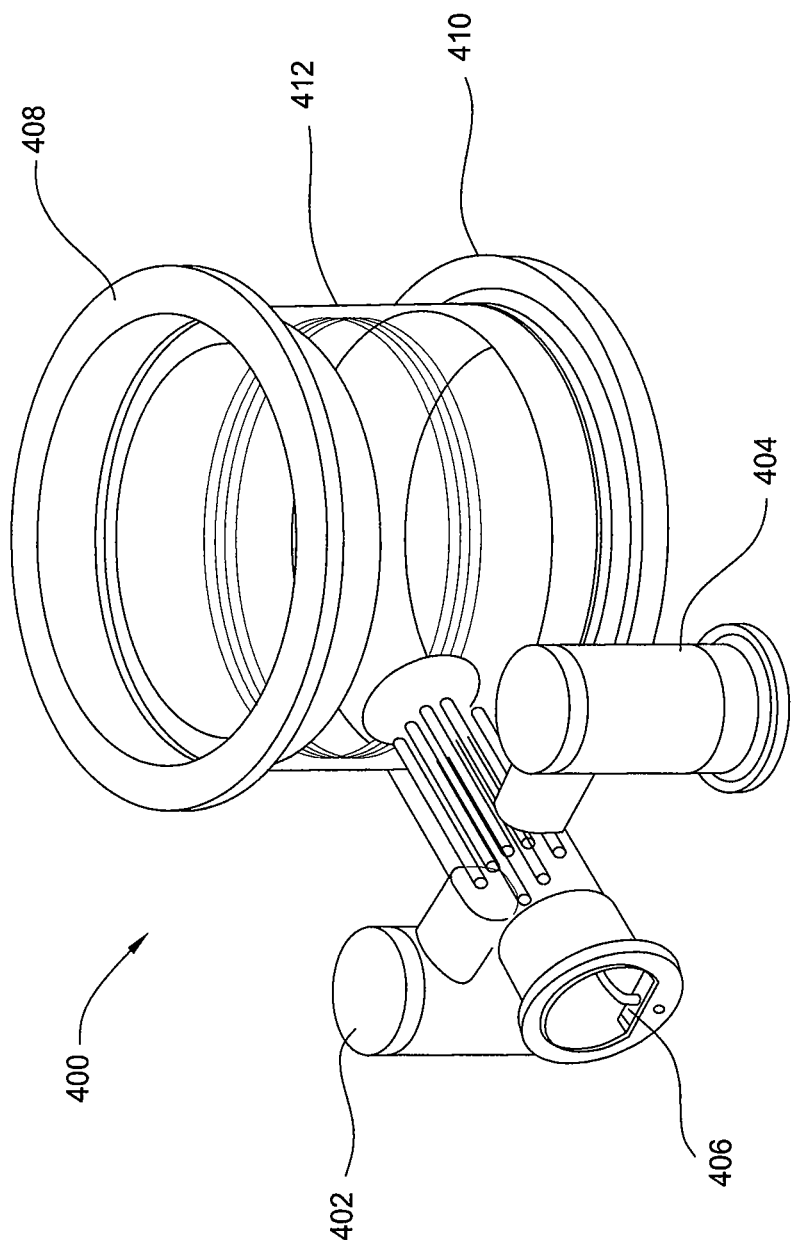
FIG. 4A is a schematic isometric view of a hydride vapor phase epitaxy (HVPE) chamber for fabricating compound nitride semiconductor devices according to embodiments of the invention.

FIG. 4A is a schematic isometric view of a hydride vapor phase epitaxy (HVPE) chamber 400 for fabricating compound nitride semiconductor devices according to embodiments of the invention. The HVPE chamber 400 includes a first precursor source 402, a second precursor source 404, a passageway 406 for a reactive gas such as a chlorine containing gas to pass, an upper ring 408, a lower ring 410, and sidewalls 412. The chlorine containing gas may react with the precursor source such as gallium or aluminum to form a chloride.

Figure 4B:
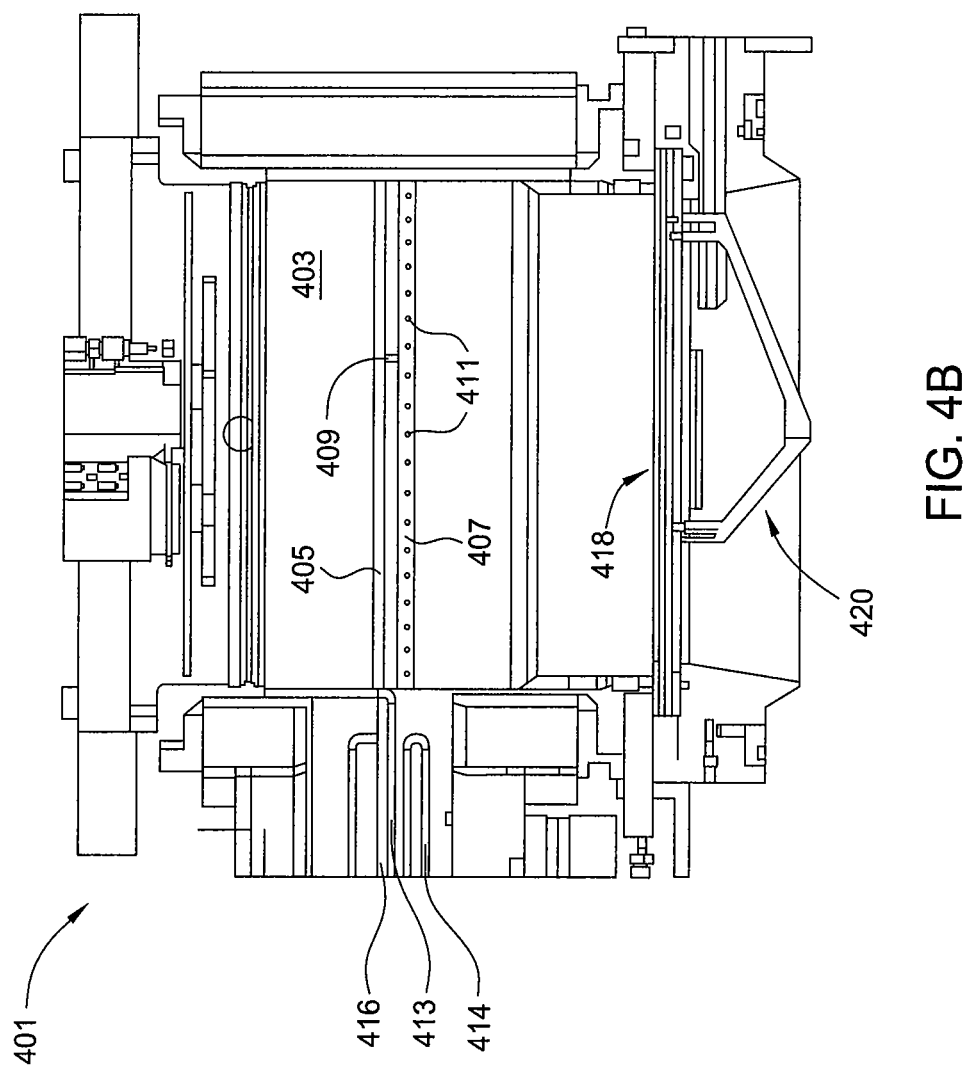
FIG. 4B is a schematic cross-sectional view of a HVPE chamber for fabricating compound nitride semiconductor devices according to embodiments of the invention.

FIG. 4B is a schematic cross-sectional view of a HVPE chamber 401 for fabricating compound nitride semiconductor devices according to embodiments of the invention. The HVPE chamber 401 includes a susceptor 418 supported by a support shaft 420. The HVPE chamber 401 also includes a chamber wall 403 having a first tube 405 coupled thereto. The first tube 405 is the tube into which the chloride reaction product initially flows before being released into the chamber. The first tube 405 is coupled to a second tube 407 via one or more connectors 409. In one embodiment, the one or more connectors 409 may be arranged to substantially balance the flow of the chloride reaction product. In one embodiment, a plurality of connectors 409 may be present that are substantially identical. In another embodiment, a plurality of connectors 409 may be present in which at least one connector 409 is different from at least one other connector 409. In another embodiment, a plurality of connectors 409 may be present that are substantially uniformly distributed between the tubes 405, 407. In another embodiment, a plurality of connectors 409 may be present that are non-uniformly distributed between the tubes 405, 407. The tube 407 has a plurality of openings 411 therethrough to permit the chloride reaction product to enter into the processing space. In one embodiment, the openings 411 may be evenly distributed along the second tube 407. In another embodiment, the openings 411 may be non-uniformly distributed along the second tube 407. In one embodiment, the openings 411 may have a substantially similar size. In another embodiment, the openings 411 may have different sizes. In one embodiment, the openings 411 may face in a direction away from the substrate. In another embodiment, the openings 411 may face in a direction generally towards the substrate. In another embodiment, the openings 411 may face in a direction substantially parallel to the deposition surface of the substrate. In another embodiment, the openings 411 may face in multiple directions. The chloride gas is formed by initially introducing a chlorine containing gas into the precursor source or boat and flowed within the passage 416. The chlorine containing gas snakes around in the passage within tubes 414. The passage 416 is heated by the resistive heaters described above. Thus, the chlorine containing gas increases in temperature before coming into contact with the precursor. Once the chlorine comes into contact with the precursor, a reaction takes place to form a chloride reaction product that is flowed through the passage 416 in gas feed 413 that is coupled to the tube 414. Then, the chloride reaction product is evenly distributed and then disposed into the HVPE chamber 401. Other aspects of the HVPE chamber 401 are described in U.S. patent application Ser. No. 12/637,019, filed Dec. 15, 2009, entitled "HVPE CHAMBER HARDWARE," which is herein incorporated by reference in its entirety.

Surface Roughening Process

Figure 5:
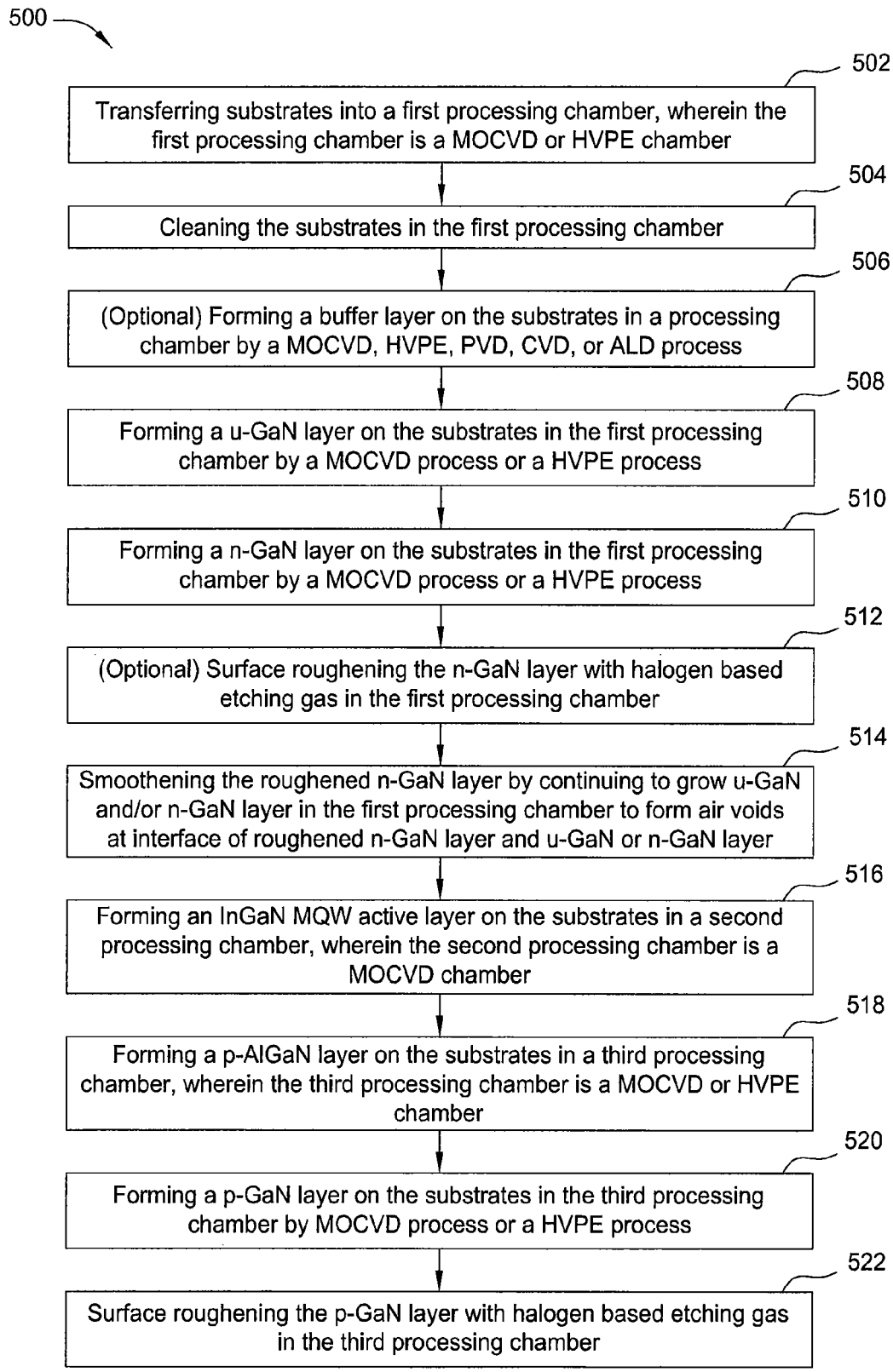
FIG. 5 is a flow diagram of a processing sequence in accordance with one embodiment of the present invention.

FIG. 5 is a flow diagram of a processing sequence 500 used to form compound nitride semiconductor devices according to at least one embodiment of the invention. FIGS. 6A to 6H are schematic cross-sectional views of a LED structure formed using the processing sequence 500 of FIG. 5.

The processing sequence begins at step 502 by transferring one or more substrates into a first substrate processing chamber. The first processing chamber may be a MOCVD chamber 300 or a HVPE chamber 400 as discussed above and shown in FIGS. 3 and 4. For deposition of a nitride structure, exemplary substrates may include sapphire ($Al_2O_3$), substantially pure silicon (Si), silicon carbide (SiC), spinel, zirconium oxide, as well as compound semiconductor substrates such as gallium-arsenide (GaAs), lithium gallate, indium phosphate (InP), and single-crystal GaN. In the example described in reference to FIGS. 6A-6H, a sapphire substrate is used.

At step 504, the substrate is optionally cleaned in the first processing chamber, such as the HVPE chamber 400. The substrate may be cleaned by flowing a cleaning gas, for example, a chlorine gas, at a flow rate between 200 sccm to about 1000 sccm for a predetermined period such as about 10 minutes, and at an elevated temperature ranging between about 625° C. to about 1100° C. The cleaning gas may include ammonia and a carrier gas. It is contemplated that the substrates may not need to be cleaned or may have been previously cleaned prior to transferring into the first processing chamber. Thereafter, process parameters such as temperature, pressure, flow ratio etc. suitable for thermal growth of a nitride layer is established within the first processing chamber as appropriate.

At step 506, an optional buffer layer 108 is formed on the substrate, as shown in FIG. 6A. The buffer layer 108 may be a binary, ternary or quaternary film comprising a solid solution of one or more Group III elements and nitrogen. Buffer layer 108 can be any crystalline film which is latticed matched (i.e., have the same cubic structure) with the Group III-Nitride crystalline film that is to be formed thereon. Buffer layer 108 may have a lattice constant between the lattice constant of the substrate and Group III-Nitrides to better match substrate and to provide thermal stability. In various embodiments of the invention, the buffer layer 108 may be GaN, AlN, AlGaN, InGaN, or InAlGaN, doped or undoped, using, for example, MOCVD, HYPE, PVD, CVD, ALD, or any other suitable process. In one embodiment, the buffer layer 108 is an AlN material deposited in a PVD chamber, which can be a stand-alone chamber or clustered to the first processing chamber as discussed above. In such case, the AlN material may be deposited on the substrate by reactively sputtering the Al in an $Ar+N_2$ gas mixture in an oxygen-free environment at a reduced pressure of about several mTorr to several Torr, for example, about 2 mTorr to about 300 Torr. It is also contemplated that the AlN material may be deposited by evaporating the Al in a $N_2$ environment, by sputtering from an AlN target in an inert Ar environment, or even by a CVD method. In various embodiments, the buffer layer 108 is formed to a thickness between 10-800 nm, but the thickness may vary and in some cases it could be up to 0.5-1.0 µm.

In an alternative embodiment, the buffer layer 108 may be a GaN material formed in the MOCVD chamber 300 (FIG. 3) using MOCVD precursor gases, for example, an organometallic precursor and a nitrogen containing precursor, such as ammonia ($NH_3$). The organometallic precursor may include a Group III metal and a carbon group, among other constituents. For example, the precursor may include an alkyl Group III metal compound such as an alkyl aluminum compound, an alkyl gallium compound, and/or an alkyl indium compound, among others. Specific precursor examples may include, but not limited to trimethylaluminum (TMA), triethyl-aluminum (TEA), trimethylindium (TMI), triethylindium (TEI), trimethylgallium (TMG), and triethylgallium (TEG). Larger sized alkyl groups, such as propyl, pentyl, hexyl, etc., may also be combined with the Group III metal. Different sized alkyl groups may also be combined in the same precursor, such as ethyldimethylgallium, methyldiethyl-aluminum, etc. Other organic moieties such as aromatic groups, alkene groups, alkyne groups, etc. may also be part of the organometallic precursor. If desired, the nitrogen containing precursor may flow in a separate gas stream into the first processing chamber that intersects with the organometallic precursor gas stream in a space in the heated reaction zone above the substrate. Carrier gases such as helium may be used to facilitate the flow of the precursors in the first processing chamber, as well as adjust the total pressure in the chamber.

In this alternative embodiment using MOCVD process, the GaN buffer layer is formed by introducing precursor gases such as trimethyl gallium (TMG) and $NH_3$ into the first processing chamber at a TMG flow rate between about 0 sccm to about 10 sccm and a $NH_3$ flow rate between about 0 slm to about 30 slm, and a susceptor temperature of about 500° C. to about 900° C. and a chamber pressure from about 50 Torr to about 300 Torr to form the GaN buffer layer with a thickness of between about 10 nm to about 50 nm. In embodiments where the buffer layer 108 is AlN, the precursor gases such as trimethyl aluminum (TMA) and $NH_3$ are introduced into the first processing chamber at a TMA flow rate between about 0 sccm to about 10 sccm and a $NH_3$ flow rate between about 0 slm to about 30 slm, and a susceptor temperature of about 500° C. to about 900° C. and a chamber pressure from about 50 Torr to about 300 Torr to form the AlN buffer layer with a thickness of between about 10 nm to about 50 nm. Alternatively, the buffer layer 108 may be a GaN material formed using a HVPE chamber. In such case, the GaN buffer layer is rapidly formed on the substrate from precursors of gallium and nitrogen using a HVPE process.

At steps 508 and 510, after deposition of the buffer layer 108, an undoped GaN (u-GaN) layer 110 and an n-doped (n-GaN) layer 112 are sequentially deposited on the substrate (not shown) or on the optional buffer layer 108 as shown in FIG. 6B. In one example the deposition is performed in chamber 300 using MOCVD precursor gases, for example, TMG, $NH_3$, and $N_2$ at a susceptor temperature of about 1050° C. and a chamber pressure of about 100 Torr to about 600 Torr. In one example, the u-GaN layer 110 may be deposited to a thickness of about 1 µm to about 2 µm, and the n-GaN layer 112 may be deposited to a thickness of between about 2 µm and about 4 µm. In one example, the u-GaN/n-GaN layer 110, 112 is deposited to a total thickness of about 4 µm.

Alternatively, an HVPE process may be used to deposit the u-GaN layer 110 and n-GaN layer 112 in an HVPE chamber such as chamber 400 or 401 shown in FIG. 4A or 4B. In such case, the HVPE chamber may be configured to provide rapid deposition of GaN material by using HVPE precursor gases, for example, $GaCl_3$ and $NH_3$ at a susceptor temperature between about 700° C. and about 1100° C. and a chamber pressure of about 450 Torr. The gallium containing precursor may be generated by flowing chlorine gas at a flow rate between about 20 sccm to about 150 sccm over liquid gallium maintained at a temperature between 700° C. to about 950° C. The liquid gallium may be maintained at a temperature of about 800° C. Ammonia is then supplied to the processing chamber at a flow rate within the range between about 6 SLM to about 20 SLM and react with the liquid gallium to form GaN layer over the substrate. If desired, the first processing chamber may be cleaned after each u-GaN and n-GaN deposition process, followed by a purge/evacuation step to remove cleaning by-products generated during the cleaning process.

At step 512, an optional in-situ surface roughening process may be performed on the n-GaN layer 112 in the first processing chamber using a halogen containing etching gas such as chlorine gas. The surface roughening process is believed to create a roughened surface 113 (FIG. 6C) on the n-GaN layer 112 that can increase the light extraction efficiency to typical GaN-based LEDs because the roughened surface 113 discourages internal light reflection and scatters the light outward in the resulting LED structure. The surface roughening process forms a plurality of etching pits in the top surface of the n-GaN layer 112. FIG. 6C illustrates an exemplary etching pits evenly distributed on the surface of the n-GaN layer 112 after $Cl_2$ etching. While v-shaped pits are shown, it is contemplated that other roughened surface profile is possible, depending upon the process conditions and techniques used to roughen the surface. Also, any suitable surface treatment processes, such as wet etch and/or mechanical processes, may be used to replace or used in conjunction with the etching process as discussed above to create a desired surface roughness of the n-GaN layer 112.

The in-situ surface roughening process may be performed by exposing the top surface of the n-GaN layer 112 to a halogen containing etching gas such as fluorine gas, chlorine gas, bromine gas, iodine gas, HI gas, HCl gas, HBr gas, HF gas, and/or other reactive gases. The etching gas may be flowed into the first processing chamber at a flow rate of about 10 sccm to about 10000 sccm, for example, from about 500 sccm to about 4000 sccm. The etching gas may be co-flowed with a carrier gas. The carrier gas may be one or more gases selected from the group of argon, nitrogen, hydrogen, helium, neon, xenon, and combinations thereof. The carrier gas may be flowed into the first processing chamber at a flow rate from about 500 sccm to about 3000 sccm. The pressure of the first processing chamber may be from about 0.001 Torr to about 500 Torr. Top surface of the n-GaN layer 112 may be roughened by subjecting the top surface of the n-GaN layer 112 to $Cl_2$ etching gas at about 650-700° C. for about 1 minute to about 10 minutes. While various halogen based etching gases may be used, chlorine gas may be preferred as it provides process conveniences for the same etching gas being also used during the chamber cleaning at step 504. If desired, a plasma etching process may be used to perform the in-situ roughening process. In such case, the plasma may be generated in-situ or by a remote plasma generator. Alternatively, the substrates may be transferred to a separate etching chamber (not shown) within the system 200 where the surface roughening process can be performed.

It is contemplated that the surface roughening process discussed herein is not limited to the n-GaN layer 112 as shown. Instead, the u-GaN layer 110 may be roughened to achieve similar light scattering effect. Alternatively, both surfaces of the n-GaN layer 112 and the u-GaN layer 110 may be roughened, depending upon the application. In some examples, the surface of the substrate may be roughened before the growth of the buffer layer 108 to achieve similar light scattering effect. Alternatively, the surface roughening process is applied to the surface of the buffer layer 108. In certain embodiments, multi-roughening cycles may be performed in the u-GaN and n-GaN layers 110, 112 with an optional purge process in between etching processes. Such multi-roughening cycles may also be applied to u-GaN and n-GaN layers 110', 112' to maximize the effect of light extraction. In various embodiments discussed herein, the average surface roughness (Ra) of the n-GaN layer 112, for example, may be in a range of about 10 nm to about several thousands nm, for example, about 200 nm to about 5000 nm.

In an alternative embodiment, air voids, pores, or bubbles may be formed within the n-GaN layer 112 to obtain light scattering effect similar to surface roughness discussed above. Voids, pores, or bubbles may be formed by, for example, exposing the substrate to an oxygen plasma during deposition of the n-GaN layer 112. The n-GaN layer 112 is then exposing to a hydrogen plasma to add hydrogen into the n-GaN layer 112. The hydrogen can be added during deposition of the n-GaN layer 112. The n-GaN layer 112 is then heated to cause hydrogen and oxygen to react to create steam, which expands to form voids in the n-GaN layer 112. In certain embodiments, the hydrogen or oxygen may be added into the n-GaN layer 112 using any suitable techniques such as an ion-implantation process. The embedded hydrogen and oxygen are then heated to a temperature sufficient to cause hydrogen and oxygen to react and create steam, which expands to form voids in the n-GaN layer 112. Alternatively, the voids or pores may be formed by multiple-cycle etching and re-growth as discussed herein in steps 512 and 514. These internal features 602 such as voids, pores, or bubbles is believed to provide one or more localized regions with indices of reflection different from that of the n-GaN layer 112. Thus, the light generated by the active layers (e.g., the InGaN MQW layer 116), when passing through the n-GaN layer 112, is scattered by these internal features rather than being reflected back to the active layers, thereby improving light extraction efficiency. It is also believed these voids or pores from this porous n-GaN layer may also provide better heat dissipation for the device.

The internal features such as voids or bubbles may be randomly distributed within the n-GaN layer 112 at any desired depth, for example, a region immediately adjacent to the upper surface 604 of the n-GaN layer 112 as shown in FIG. 6C'. If desired, the internal features may be distributed throughout the entire n-GaN layer 112. It is contemplated that the dimension and volume density of the voids or bubbles can be controlled by adjusting parameters such as heating temperature, pressure, ion energy, or processing time etc. Other internal features are possible as long as they can cause variation in the refractive index of a portion of the n-GaN layer 112 and thus light scattering to raise light output of the resultant LED. Similarly, the concept of this embodiment is not limited to the n-GaN layer 112 and may be applied to the u-GaN layer 110, both surfaces of the n-GaN layer 112 and the u-GaN layer 110, the buffer layer 108, or even to the substrate, depending upon the application.

While roughened surface 113 is shown uniformly formed on the surface of the n-GaN layer 112 (FIG. 6C), the surface roughness process may be selectively performed on the surface of the n-GaN layer 112. In such case, an etch mask layer (not shown) may be used to provide a desired pattern of roughness on the surface of the n-GaN layer 112. If a nano-roughened surface is preferred, a nanomask layer (not shown) may be deposited on the surface of the n-GaN layer 112 and etched by an appropriate etching technique such as laser etching to transfer a desired pattern to the n-GaN layer 112, thereby forming nanometer-sized dots or pinholes on the surface of the n-GaN layer 112. Alternatively, the nanometer-sized dots or pinholes can be formed in-situ without etching by depositing a very thin layer of mask material without full-coverage of the surface of the n-GaN layer 112. The nanomask layer is then removed from the nano-roughened surface of the n-GaN layer 112 or can remain on the surface of the n-GaN layer 112. In one embodiment, the nanomask layer may be a metallic layer formed from at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof. Alternatively, the nanomask layer may be a dielectric layer such as $SiN_x$, $SiO_x$, AlN, $Al_2O_3$, BN, etc. In another embodiment, the roughened surface is formed by using silica microspheres as an etch mask to transfer micro-scale roughness into the surface of the n-GaN layer 112. The size of the silica microspheres may range from about 20 nm to about 200 nm in diameter, depending on the order of the wavelength of light generated by the LED structure.

At step 514, once the roughened surface 113 is formed, an u-GaN layer 110' and/or n-GaN layer 112' are sequentially grown on the roughened n-GaN layer 112, as shown in FIG. 6D. The u-GaN layer 110' and n-GaN layer 112' may be formed by a MOCVD process or a HVPE process in the first processing chamber in a similar manner as discussed above at steps 508 and 510 without fully filling the underlying etching pits. That is, the underlying etching pits are partially filled during deposition of the u-GaN layer 110', thereby forming air voids or bubbles at the interface of the n-GaN layer 112 and the u-GaN layer 110'. These voids or bubbles are believed to provide one or more localized regions with indices of reflection different from that of the n-GaN layer 112. Thus, the light generated by the active layers (e.g., the InGaN MQW layer 116), when passing through the n-GaN layer 112, is scattered by voids or bubbles rather than being reflected back to the active layers, thereby improving light extraction efficiency.

To control filling of the etching pits, the growth conditions of the layer to be deposited on the roughened n-GaN layer 112 may be adjusted by modulating the vertical growth rate versus lateral growth rate of the u-GaN layer 110' (or GaN-based layer deposited on the roughened n-GaN layer 112). For instance, the growth rates along lateral lattice plane (e.g., <112-0> a-axis or <101-0> m-axis) versus vertical lattice plane (e.g., <0001> c-axis) of the u-GaN layer 110' or GaN-based layer can be modulated by adjusting the process conditions which include, but are not limited to, growth temperature, $N_2/H_2$ ratio in a carrier gas, chamber pressure, group DIN precursor ratio, or introduction of certain impurities such as magnesium (Mg) or silicon (Si) in the vapor phase, etc. It is also contemplated that the control of the vertical growth rate versus lateral growth rate can be used to control the shape of the etching pits. For example, the etching pits can be created by enhancing the vertical growth rate to slow down the lateral growth rate of the GaN layer.

While FIG. 6D shows the u-GaN layer 110' and n-GaN layer 112' sequentially formed on the roughened n-GaN layer 112, in certain embodiments the growth of the n-GaN layer 112 material may be first resumed and followed by deposition of the u-GaN layer 110' and n-GaN layer 112'. If desired, the processing chamber may be cleaned after each u-GaN and n-GaN deposition process, followed by a purge/evacuation step to remove cleaning by-products generated during the cleaning process. In cases where the surface roughening process is performed on the u-GaN layer 110, the growth can be resumed from the u-GaN 110 materials and followed by deposition of the n-GaN 112 materials, or directly resumed from the n-GaN 112 materials.

Figure 6F:
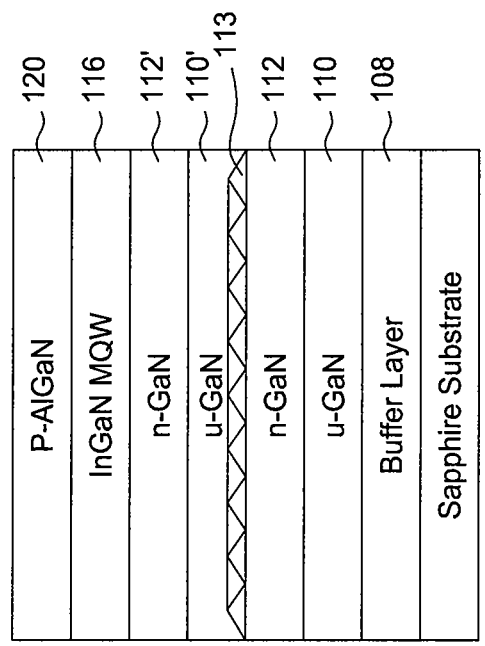
Figure 6E:
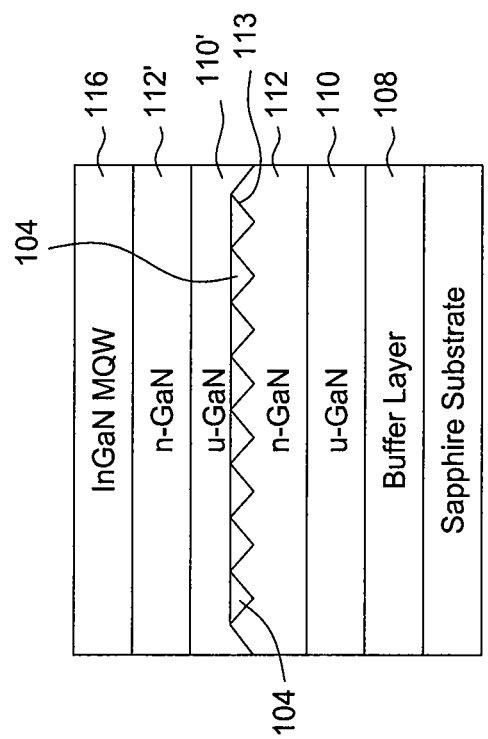

At step 516, an InGaN multi-quantum-well (MQW) active layer 116 is then grown on the n-GaN layer 112' in a second processing chamber, as shown in FIG. 6E. In one example, the second processing chamber is a MOCVD chamber where the InGaN multi-quantum-well (MQW) active layer 116 is formed using MOCVD process by introducing, for example, trimethyl gallium (TMG), trimethyl indium (TMI), and $NH_3$ in a $H_2$ carrier gas flow at a susceptor temperature of from about 700° C. to about 850° C. and a chamber pressure from about 100 Torr to about 500 Torr. The MOCVD process is believed to provide highly uniform deposition, perhaps at the expense of overall deposition rate. However, the InGaN MQW layer 116 may be formed using the HVPE chamber as shown in FIG. 4.

At step 518, a p-AlGaN layer 120 is then grown on the InGaN MQW layer 116, as shown in FIG. 6F, in a third processing chamber (either MOCVD chamber or HVPE chamber) using a MOCVD process or a HVPE process. When the p-AlGaN layer 120 is grown using MOCVD process, precursors such as trimethyl aluminum (TMA), trimethyl gallium (TMG), and $NH_3$ may be provided in a $H_2$ carrier gas flow at a susceptor temperature of about 1020° C. and a pressure of about 200 Torr. By using two separate chambers to form the InGaN MQW layer 116 and p-AlGaN layer 120, the growth of the p-type layer and the MQW layer can be separated into different chambers to avoid the Mg—In cross-contaminations. Meanwhile, the system throughput is also increased by eliminating cleaning and adjustment to the process chambers as would otherwise required if the InGaN and AlGaN layers were formed in the same chamber.

Figure 6H:
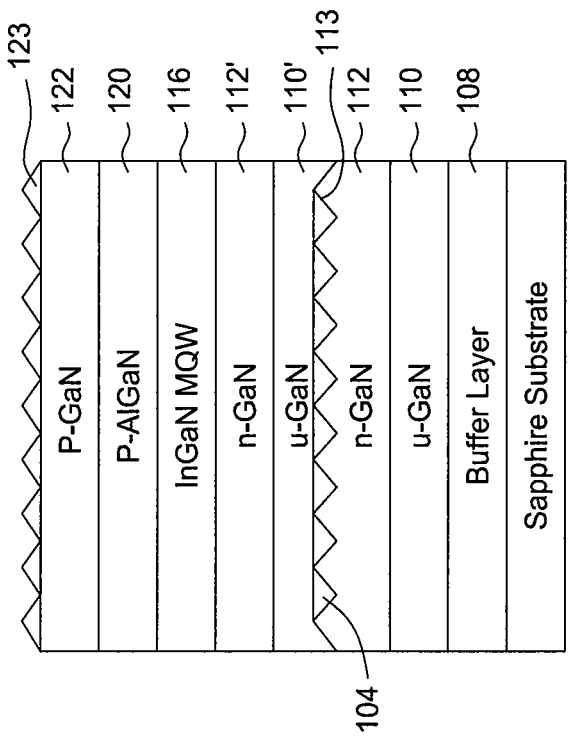
Figure 6G:
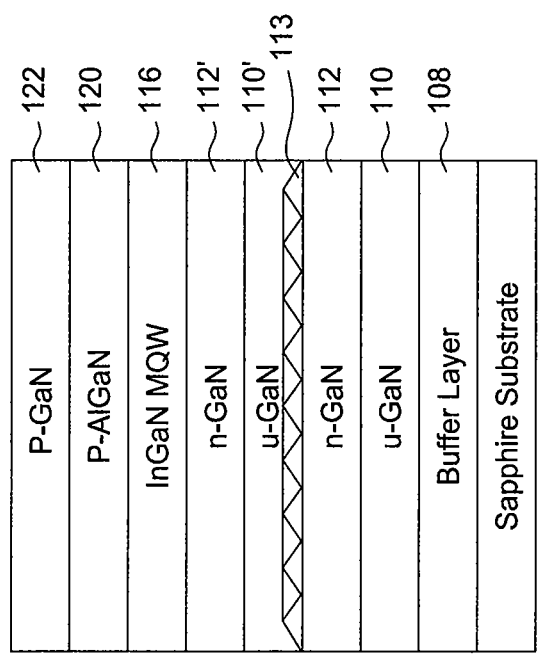

At step 520, a p-GaN contact layer 122 is grown on the p-AlGaN layer 120, as shown in FIG. 6G, in the third processing chamber using either MOCVD process or a HVPE process. In cases where MOCVD process is used, precursors such as trimethyl gallium (TMG), $NH_3$, $Cp_2Mg$, and $N_2$ may be flowed into the third processing chamber at a susceptor temperature of 1020° C. and a pressure of about 100 Torr. In another example, the p-GaN contact layer 122 is grown in an ammonia free environment using flows of TMG, $Cp_2Mg$, and $N_2$ at a susceptor temperature of between about 850° C. and about 1050° C. If desired, the one or more substrates may be heated at a temperature ramp-up rate between about 5° C./second to about 10° C./second during formation of the p-GaN contact layer 122. In certain examples, the p-GaN contact layer 122 and the p-AlGaN layer 120 may be deposited in different chambers to reduce possible cross-contaminations.

At step 522, after deposition of the p-GaN contact layer 122, an in-situ surface roughening process may be performed on p-GaN contact layer 122 in the third processing chamber using a halogen containing etching gas, such as chlorine gas, to form a roughened surface 123 as shown in FIG. 6H. The surface roughening process in step 522 may be performed in a similar fashion to the step 512 as discussed above. The surface of the p-GaN contact layer 122 may have etching pits as shown in FIG. 6H or have air voids or bubbles randomly distributed within the p-GaN contact layer 122 at a desired depth (not shown). Due to the existence of this roughened light-extracting surface (i.e., roughened surface 123), the light emitted from the active layers toward the roughened p-GaN contact layer 122 surface is scattered by the roughened surface 123 rather than being reflected back to the active layers, thereby increasing the upward light output for the resultant LED.

Figures 7A, 7B:
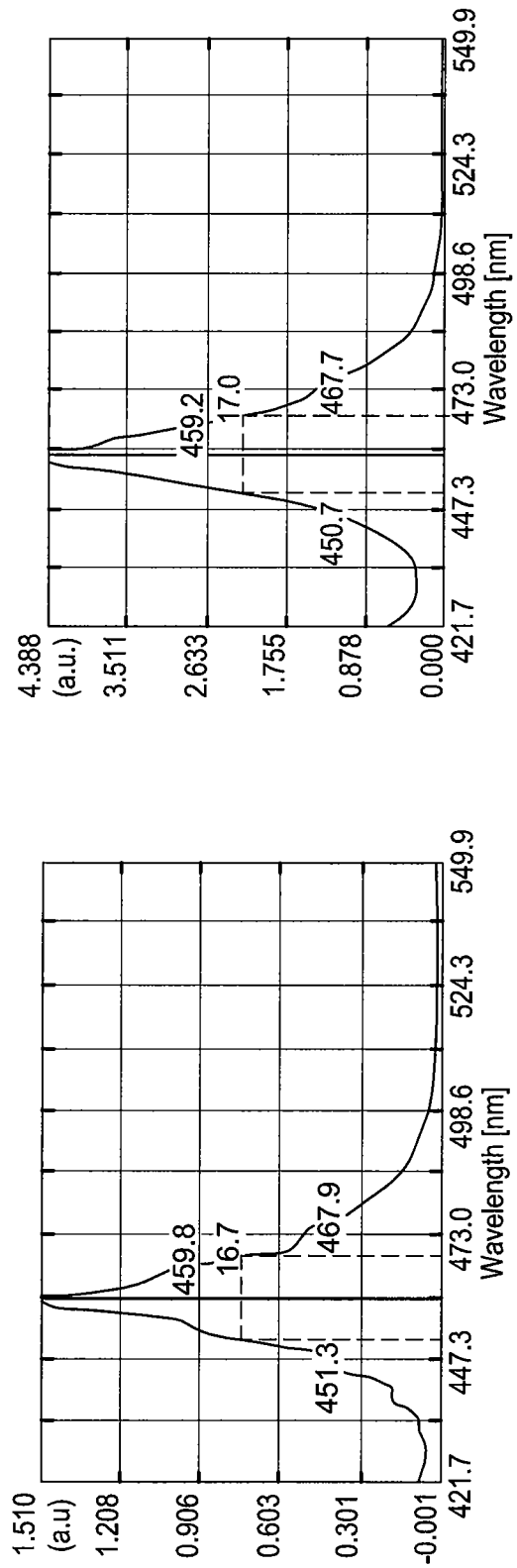
FIG. 7A shows photoluminescence (PL) intensity as a function of wavelength for conventional LEDs without a roughened surface.
FIG. 7B shows photoluminescence (PL) intensity as a function of wavelength of a LED structure with a roughened p-GaN contact layer according to at least one embodiment of the present invention.

FIG. 7A shows photoluminescence (PL) intensity as a function of wavelength for conventional LEDs without a roughened surface. FIG. 7B shows photoluminescence (PL) intensity in arbitrary units (a.u.) as a function of wavelength in units of nm, emitted from a LED structure prepared by at least one embodiment of the present invention shown in FIGS. 6A-6H. Photoluminescene (PL) is light emission generated by photon excitation; for example, the spectral output generated when energetic photons are used as the excitation source. As can be seen in FIG. 7B, the LED with a roughened surface shows a peak at 459.2 nm (at near the same location as the PL spectral lasting line shown in FIG. 7A) with intensity about 2 to 3 times higher than conventional LEDs (FIG. 7A) without a roughened surface, indicating that the light is scattered by the roughened surface or voids/bubbles formed at the interface of the n-GaN layer and the adjoining layer, and therefore improved light extraction efficiency is achieved.

After the top surface roughening process in step 522, the completed structure may either be transferred to the batch load lock chamber 209 for storage or may exit the processing system 200 via the load lock chamber 208 and the load station 210, as shown in FIG. 2. If desired, multiple carrier plates 250 may be individually transferred into and out of each substrate processing chamber for deposition processes, each carrier plate 250 may then be stored in the batch load lock chamber 209 and/or the load lock chamber 208 while either the subsequent processing chamber is being cleaned or the subsequent processing chamber is currently occupied.

Embodiments of the present invention described above provide methods for enhancing the light extraction by surface roughening of the bottom n-GaN layer and/or top p-GaN such that the internal light in the active region can scatter outwardly and result in higher external quantum efficiency. Various surface roughening processes may be adapted to form v-shaped etch pits on the surface of the n-GaN layer or air voids or bubbles within the n-GaN layer at a desired level. The surface roughening process can greatly benefit the light extraction efficiency to typical GaN-based LEDs because the surface roughness of the top surface of the n-GaN layer discourages internal light reflection and scatters the light outward in the resulting LED structure. The surface roughening process may be further performed on a top surface of a p-GaN layer so that the light emitted from the active layers toward the roughened p-GaN layer surface is scattered by the roughened surface and not reflected back to the active layers, thereby enhancing the upward light output for the resulting LED structure.

While the foregoing is directed to embodiments of the present invention, other and further embodiments of the invention may be devised without departing from the basic scope thereof, and the scope thereof is determined by the claims that follow.

What is claimed is:

1. A method for fabricating a semiconductor structure, comprising:
   forming a n-doped group III nitride layer over a substrate;
   subjecting the n-doped group III nitride layer to a surface roughening process to form etching pits in a top surface of the n-doped group III nitride layer;
   partially filling the etching pits with an undoped group III nitride layer to form voids between the undoped group III nitride layer and the top surface of the n-doped group III nitride layer;
   forming a multi-quantum-well (MQW) active layer over the undoped group III nitride layer; and
   forming a p-doped group III nitride layer over the multi-quantum-well active layer.

2. The method of claim 1, further comprising:
   subjecting the p-doped group III nitride layer to a surface roughening process to form etching pits in a top surface of the group III nitride layer.

3. The method of claim 2, wherein the surface roughening process used to treat the top surface of the n-doped group III layer and the p-doped group III nitride layer comprises exposing the top surface of the n-doped group III layer and the p-doped group III nitride layer to a halogen containing etching gas.

4. The method of claim 1, wherein the n-doped and the undoped group III nitride layers are n-doped GaN and undoped GaN material, respectively.

5. The method of claim 1, further comprising:
   forming one or more light scattering features in the n-doped group III nitride layer, wherein the one or more light scattering features have a refractive index different from a refractive index of the n-doped group III nitride layer.

6. The method of claim 2, wherein the etching pits are selectively formed in the top surface of the n-doped group III nitride layer using an etch mask layer.

7. The method of claim 6, wherein the n-doped group III nitride layer has an average surface roughness (Ra) ranging from about 10 nm to about 5000 nm.

8. The method of claim 1, further comprising:
   forming a buffer layer on the substrate prior to formation of the n-doped group III nitride layer, wherein the buffer layer is made of a doped or undoped material selected from the group consisting of GaN, AlN, AlGaN, InGaN, and InAlGaN.

9. The method of claim 8, wherein the buffer layer is deposited by a physical vapor deposition (PVD), metal-organic chemical vapor deposition (MOCVD), hydride vapor phase epitaxial (HVPE), chemical vapor deposition (CVD), or atomic layer deposition (ALD) process.

10. The method of claim 1, further comprising:
    forming a ternary group III nitride layer on the multi-quantum-well (MQW) active layer.

11. The method of claim 1, wherein forming the n-doped group III nitride layer is performed in a first processing chamber and forming the multi-quantum-well (MQW) active layer is performed in a second processing chamber.

12. The method of claim 11, wherein forming the ternary group III nitride layer and forming the undoped group III nitride layer are performed in a third processing chamber.

13. The method of claim 12, wherein the n-doped group III nitride layer, the multi-quantum-well (MQW) active layer, the ternary group III nitride layer, and the undoped group III nitride layer are formed using a MOCVD process or a HVPE process.

14. The method of claim 8, further comprising:
    an undoped group III nitride layer formed between the n-doped group III nitride layer and the buffer layer.

15. The method of claim 8, wherein the buffer layer is a doped or undoped AlN deposited by a physical vapor deposition (PVD) process.

16. A method for fabricating a semiconductor structure, comprising:
    forming a buffer layer on a substrate;
    forming an undoped group III nitride layer on the buffer layer;
    forming a n-doped group III nitride layer on the undoped group III nitride layer;
    forming one or more light scattering features in the n-doped group III nitride layer, wherein the one or more light scattering features have a refractive index different from a refractive index of the n-doped group III nitride layer;
    forming an undoped group III nitride layer over the top surface of the n-doped group III nitride layer; and
    forming a p-doped group III nitride layer over the undoped group III nitride layer.

17. The method of claim 16, wherein the one or more light scattering features are distributed throughout the n-doped group III nitride layer or within the n-doped group III nitride layer at a region adjacent to the top surface of the n-doped group III nitride layer.

18. The method of claim 16, wherein the one or more light scattering features comprises voids or bubbles.

19. The method of claim 16, wherein the buffer layer is a doped or undoped AlN deposited by a physical vapor deposition (PVD) process.

* * * * *

UNITED STATES PATENT AND TRADEMARK OFFICE
CERTIFICATE OF CORRECTION

PATENT NO. : 8,642,368 B2
APPLICATION NO. : 13/045387
DATED : February 4, 2014
INVENTOR(S) : Jie Su It is certified that error appears in the above-identified patent and that said Letters Patent is hereby corrected as shown below:

In the Specification

In Detailed Description:

Column 11, Line 38, please delete "HYPE" and insert --HVPE-- therefor;

Column 15, Line 37, please delete "DIN" and insert --III/V-- therefor.

Signed and Sealed this
Twentieth Day of May, 2014

Michelle K. Lee
*Deputy Director of the United States Patent and Trademark Office*